United States Patent
Partain et al.

(10) Patent No.: US 9,268,037 B2
(45) Date of Patent: Feb. 23, 2016

(54) UNIVERSAL KV-MV IMAGERS

(71) Applicant: Varian Medical Systems, Inc., Palo Alto, CA (US)

(72) Inventors: Larry Partain, Los Altos, CA (US); Edward Seppi, Portola Valley, CA (US); George Zentai, Mountain View, CA (US); Hassan Mostafavi, Los Altos, CA (US); Ivan Mollov, Mountain View, CA (US); Daniel Morf, Buch am Irchel (CH)

(73) Assignee: Varian Medical Systems, Inc., Palo Alto, CA (US)

( * ) Notice: Subject to any disclaimer, the term of this patent is extended or adjusted under 35 U.S.C. 154(b) by 267 days.

(21) Appl. No.: 13/906,724

(22) Filed: May 31, 2013

(65) Prior Publication Data

US 2014/0353513 A1 Dec. 4, 2014

(51) Int. Cl.
*G01T 1/20* (2006.01)
*H01L 27/146* (2006.01)
*G01T 1/16* (2006.01)

(52) U.S. Cl.
CPC ............... *G01T 1/20* (2013.01); *G01T 1/1606* (2013.01); *G01T 1/2018* (2013.01); *H01L 27/14663* (2013.01)

(58) Field of Classification Search
CPC ........... G01T 1/16; G01T 1/1606; G01T 1/20; G01T 1/2006; H01L 27/14663
See application file for complete search history.

(56) References Cited

U.S. PATENT DOCUMENTS

| | | | |
|---|---|---|---|
| 2004/0228436 A1* | 11/2004 | Zentai et al. | 378/19 |
| 2006/0255279 A1* | 11/2006 | Simon et al. | 250/370.09 |
| 2007/0114426 A1* | 5/2007 | Tkaczyk | 250/370.09 |
| 2009/0283682 A1* | 11/2009 | Star-Lack et al. | 250/363.1 |
| 2012/0025086 A1* | 2/2012 | Takihi | 250/366 |
| 2013/0168563 A1* | 7/2013 | Kim et al. | 250/370.06 |
| 2013/0303902 A1* | 11/2013 | Smith et al. | 600/431 |

* cited by examiner

*Primary Examiner* — Mark R Gaworecki
(74) *Attorney, Agent, or Firm* — Houst Consulting

(57) ABSTRACT

An x-ray imaging device may include a detector array and an x-ray converting layer coupled to the detector array. The detector array and the x-ray converting layer may be configured such that x-rays traverse the detector array before propagating in the x-ray converting layer. The x-ray imaging device may also include a buildup layer behind the x-ray converting layer. The x-ray imaging device may be used as a "universal" imager for both MV and kV imaging.

31 Claims, 6 Drawing Sheets

UNIVERSAL KV-MV IMAGERS

CROSS REFERENCE TO RELATED APPLICATIONS

This application is related to U.S. application Ser. No. 12/910,060 filed on Oct. 22, 2010 and entitled "Method and Apparatus for Multi-Layered High Efficiency Mega-Voltage Imager," the disclosure of which is incorporated herein by reference.

TECHNICAL FIELD

Embodiments of this disclosure relate to x-ray imaging devices and methods. In particular, x-ray imagers suitable for both kilovoltage (kV) and megavoltage (MV) x-ray imaging are described.

BACKGROUND

The outcomes of radiation therapy are often decided by the ability to deliver adequate dose to the tumor without also increasing dose to adjacent normal tissue which leads to unacceptable toxicity. For many patients, an effective strategy for increasing tumor dose is via stereotactic body radiotherapy (SBRT) and hypofractionated radiotherapy (HFRT). SBRT and HFRT may reduce the number of treatment sessions and enable better and more efficient cancer treatment. However, the application of SBRT and HFRT requires accurate patient setup and real-time image-based monitoring of patient/tumor position during treatment.

Dynamic adaptive radiotherapy (DART) opens a new era of cancer treatment. DART, as the name suggests, adapts dynamically to the ever-changing patient, and can adjust treatment delivery parameters in real time to correct for intrafractional motion and ensure that radiation is always aimed at the tumor rather than normal tissue. Application of DART also requires improved imaging for patient positioning and real-time tracking of the patient and tumor motion during treatment.

Radiation delivery machines such as LINACs have been equipped with electronic portal imaging devices (EPID) for acquisition of portal images to confirm patient setup. Existing EPIDs use megavoltage x-rays to provide 2D images but not 3D images. Further, existing MV imaging suffers from inferior image contrast and resolution, and requires higher dose than does kV imaging due to lower X-ray absorption of the devices at MV energies.

Accordingly, there is a need for electronic portal imaging devices capable of providing high-quality images using low-dose megavoltage x-rays. There is a need for imaging devices that are suitable for both kV and MV imaging and provides reliable 3D patient tracking in real time.

SUMMARY

In some exemplary embodiments, an x-ray imaging device may include a detector array and an x-ray converting layer coupled to the detector array. The detector array and the x-ray converting layer may be configured such that x-rays traverse the detector array before propagating in the x-ray converting layer. The x-ray imaging device may also include a buildup layer behind the x-ray converting layer. The buildup layer may be made from a material comprising copper (Cu), aluminum (Al), beryllium (Be), titanium (Ti), lead (Pb), tantalum (Ta), tungsten (W), silver (Ag), gold (Au), palladium (Pd), Platinum (Pt), or their alloys or mixture. The x-ray converting layer may comprise a scintillator configured to produce light by interacting with x-rays having a kilovoltage energy level and/or a megavoltage energy level.

In some exemplary embodiments, an x-ray imaging device may include a detector array having a first detector region and a second detector region, a first x-ray converting layer coupled to the first detector region, and a second x-ray converting layer coupled to the second detector region. The x-ray imaging device may be configured such that x-rays traverse the detector array before propagating in the first and second x-ray converting layers. The x-ray imaging device may include a buildup layer behind the second x-ray converting layer. The buildup layer may be made from a material comprising copper (Cu), aluminum (Al), beryllium (Be), titanium (Ti), lead (Pb), tantalum (Ta), tungsten (W), silver (Ag), gold (Au), palladium (Pd), or Platinum (Pt), or an alloy thereof.

The first and second x-ray converting layers may be configured such that the second x-ray converting layer is in a center of and surrounded by the first x-ray converting layer. The first x-ray converting layer may comprise a first scintillator having a first thickness, and the second x-ray converting layer may comprise a second scintillator having a second thickness greater than the first thickness. The second scintillator may be cesium iodide (CsI) or have a columnar structure.

In some exemplary embodiments, an x-ray imaging device may include a first imaging unit and a second imaging unit that are coupled in series in a direction of x-ray propagation. The first imaging unit may include a first x-ray converting layer and a first detector array, and may be configured such that x-rays traverse the first detector array before propagating in the first x-ray converting layer. The second imaging unit may include a second x-ray converting layer and a second detector array, and may be configured such that x-rays traverse the second detector array before propagating in the second x-ray converting layer. The x-ray imaging device may include a buildup layer between the first and second imaging units. Alternatively, the x-ray imaging device may include a light reflecting layer between the first and second imaging units.

The first x-ray converting layer of the first imaging unit may comprise a first scintillator having a first area and a first thickness, and the second x-ray converting layer of the second imaging unit may comprise a second scintillator having a second area and a second thickness. The second thickness may be greater than the first thickness. The second area may be smaller than the first area or same as the first area. The second scintillator may comprise cesium iodide (CsI) and have a columnar structure.

In some exemplary embodiments, an x-ray imaging device may include a first imaging unit and a second imaging unit which are coupled and configured such that x-rays traverse the first imaging unit before propagating in the second imaging unit. The first imaging unit may include a first detector array, a first x-ray converting layer, and a first buildup layer. The second imaging unit may include a second detector array, a second x-ray converting layer, and a second buildup layer. The first imaging unit may be configured such that x-rays traverse the first detector array before propagating in the first x-ray converting layer, and the first buildup layer is disposed behind the first x-ray converting layer. The second imaging unit may be configured such that x-rays traverse the second detector array before propagating in the second x-ray converting layers, and the second buildup layer is disposed behind the second x-ray converting layer. Alternatively, the second imaging unit may be configured such that x-rays traverse the second x-ray converting layers before propagating in the second detector array.

In some alternative embodiments, an x-ray imaging device may include a first imaging unit and a second imaging unit which are coupled and configured such that x-rays traverse the first imaging unit before propagating in the second imaging unit. The first imaging unit may include a first detector array and a first x-ray converting layer. The second imaging unit may include a second detector array, a second x-ray converting layer, and a buildup layer. The first imaging unit may be configured such that x-rays traverse the first detector array before propagating in the first x-ray converting layer. The second imaging unit may be configured such that x-rays traverse the second x-ray converting layers before propagating in the second detector array, and the buildup layer is disposed before the second x-ray converting layer.

This Summary is provided to introduce selected embodiments in a simplified form and is not intended to identify key features or essential characteristics of the claimed subject matter, nor is it intended to be used as an aid in determining the scope of the claimed subject matter. Other embodiments of the disclosure are further described in the Detail Description.

BRIEF DESCRIPTION OF THE DRAWINGS

These and other features and advantages of the disclosed methods and apparatuses will become better understood upon reading of the following detailed description in conjunction with the accompanying drawings and the appended claims provided below, where:

DETAILED DESCRIPTION

Figure 1:
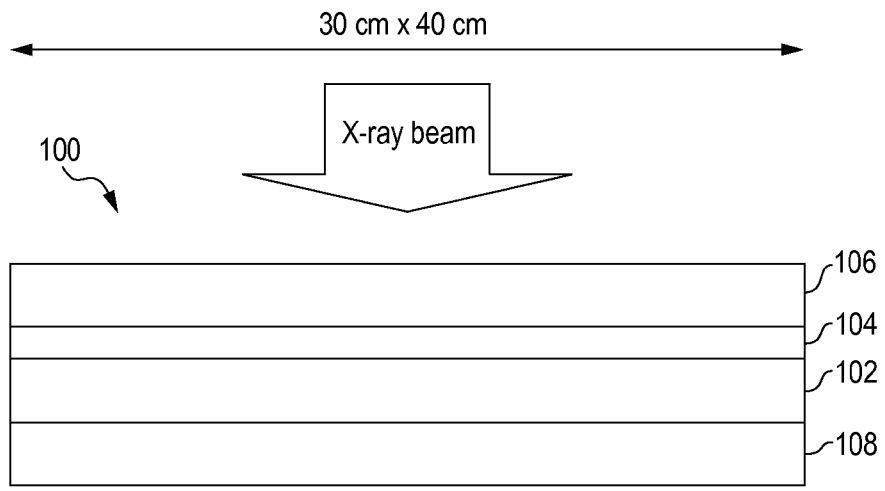
FIG. 1 is a schematic representation of an x-ray imaging device according to some embodiments of this disclosure.

Various embodiments of methods and devices for x-ray imaging are described. It is to be understood that the disclosure is not limited to the particular embodiments described as such may, of course, vary. An aspect described in conjunction with a particular embodiment is not necessarily limited to that embodiment and can be practiced in any other embodiments.

For instance, while various embodiments are shown and described in conjunction with imagers using scintillator materials as x-ray converting layers, it will be appreciated by one of ordinary skill in the art that the described methods can also be employed in imagers using photoconductor or semiconductor materials as x-ray converting layers. Further, in the following description, numerous specific details such as examples of specific components, dimensions, processes, etc. may be set forth in order to provide a thorough understanding of the disclosure. It will be apparent, however, to one of ordinary skill in the art that these specific details need not be employed to practice embodiments of the disclosure. In other instances, well known components or steps may not be described in detail in order to avoid unnecessarily obscuring the embodiments of the disclosure.

Various relative terms such as "above," "below," "top," "bottom," "height," "depth," "width," and "length," etc. may be used to facilitate description of various embodiments. The relative terms are defined with respect to a conventional orientation of a structure and do not necessarily represent an actual orientation of the structure in manufacture or use. The following detailed description is, therefore, not to be taken in a limiting sense. As used in the description and appended claims, the singular forms of "a," "an," and "the" may include plural references unless the context clearly dictates otherwise.

As used herein, the term "x-ray converting layer" refers to a functional layer in an x-ray imager which is configured to convert x-ray photons to light or electrical charges. An x-ray converting layer may include a scintillator material configured to convert x-ray photons to visible light. A scintillator material may interact with x-ray photons, which raise the energies of the atoms in the scintillator. When the energetically excited atoms in the scintillator decay back to their ground state they emit light. The light may then be detected by a detector array coupled to the scintillator. Alternatively, an x-ray converting layer may include a photoconductor or semiconductor material configured to convert x-ray photons directly to electron-hole pairs. Under an applied voltage, the produced electrons and holes migrate to electrodes respectively depending on the voltage polarity. The electrical charges gathered by the electrodes may then be detected by a detector array.

As used herein, the terms "imaging unit" and "imaging layer" may be used interchangeably and refer to a subunit of a multi-layered imaging device, which includes an x-ray converting layer configured to convert x-ray photons to light or electrical charges, and a detector array configured to detect the light or electrical charges converted from the x-ray photons.

As used herein, the term "reverse geometry" refers to a configuration of an x-ray imager wherein a detector array is situated between an x-ray source and an x-ray converting layer. The term "forward geometry" refers to a configuration of an x-ray imager wherein an x-ray converting layer is situated between an x-ray source and a detector array.

As used herein, the term "buildup layer" refers to a layer of a material in an x-ray imager which may generate high energy electrons from interaction with high energy x-ray radiation. A buildup layer may absorb and interact with high energy X-rays to generate a high energy electron shower. The high energy electrons may leave the buildup layer and enter into a scintillator or photoconductor layer adjacent thereto to generate visible light or electron-hole pairs. High-energy electrons are generated and a large portion of the high-energy electrons may be projected in a direction substantially same as or opposite to the incident x-ray photons. The buildup layer is generally made of a metal.

Exemplary embodiments will now be described with reference to the figures. It should be noted that some figures are not necessarily drawn to scale. The figures are only intended to facilitate the description of specific embodiments, and are not intended as an exhaustive description or as a limitation on the scope of the disclosure.

FIG. 1 schematically shows an exemplary x-ray imaging device 100 according to some embodiments of the disclosure. The imaging device 100 may include an x-ray converting layer 102 and a detector array 104 over a substrate 106. The imaging device 100 may be configured to have a reverse geometry, i.e., the detector array 104 is situated between the x-ray converting layer 102 and the x-ray source (not shown). The imaging device 100 may also include a buildup layer 108 at the bottom of the imaging device 100.

The x-ray converting layer 102 may include a scintillator material. By way of example, suitable scintillator materials include but are not limited to: gadolinium oxisulfide ($Gd_2O_2S$:Tb, or "Lanex"), cadmium tungstate ($CdWO_4$), bismuth germanate ($Bi_4Ge_3O_{12}$ or BGO), and cesium iodide (CsI), etc.

The detector array 104 may include a plurality of detector elements configured to generate electric signals in response to the light produced in the scintillator 102. Each detector element may include a photodiode to convert light into electrical charges, and a switching element such as a thin film transistor (TFT) to access the electrical charges by readout electronics. The TFTs may be amorphous silicon (a-Si) or polycrystalline silicon TFTs. The TFTs and photodiodes may be formed on the substrate 106 by any methods known in the art, and thus their detail description is omitted here in order to avoid unnecessarily obscuring the description of the embodiments of this disclosure. Alternatively, the detector elements may include other switching elements such as organic transistors, charge coupled devices (CODs), CMOS, metal oxide transistors, or transistors made of other semiconductor materials, and/or switching diodes. Optionally the detector elements may contain other components for signal or charge buffering and amplification. Each detector element may form a pixel of the X-ray image generated using the imaging device 100. The detector array 104 may also include a pixel access circuit (not shown), which may be configured to access the detector elements and reads the electric signals from the detectors. The process of accessing detector elements and reading electric signals therefrom is known to those skilled in the art.

The substrate 106 may be made from a wide variety of materials. It may be elemental and/or compound substrate. Exemplary materials suitable for the substrate include, but are not limited to, silicon, quartz, ceramics, glass, plastics such as Kapton, and metals etc. As used herein, the substrate may mean a base on which the detector array 104 can be deposited and processed. The substrate 106 may also mean to include other layers, structures, or substances on which a detector array formed on a base is disposed or integrated.

In some embodiments, the substrate 106 may be constructed with a material that has low attenuation of kV x-rays. For example, the substrate may be a glass substrate having a low concentration of heavy metal contaminants such as lead. This may allow x-rays having kilovoltage energy levels to pass through the substrate to interact with the x-ray converting material in the imaging device.

The buildup layer 108 may be made of a metal. Suitable metals that can be used for making the buildup layer include and are not limited to, copper (Cu), aluminum (Al), beryllium (Be), titanium (Ti), lead (Pb), tantalum (Ta), tungsten (W), silver (Ag), gold (Au), palladium (Pd), Platinum (Pt), and their alloys or mixture etc. The buildup layer may absorb and interact with high energy X-rays to generate a shower of high energy electrons. The high energy electrons may leave the buildup layer and enter into the adjacent x-ray converting layer 102 to generate additional light, which may then be detected by the detector array 104, thereby improving the contrast and efficiency of the imaging device 100 in MV imaging. A large portion of the high-energy electrons generated may be projected in a direction substantially same as or opposite to the incident x-ray photons.

The thickness of the buildup layer 108 may be selected based on the X-ray energy, the buildup layer material, and the scintillator layer material, etc. The thickness of the buildup layer should be selected such that the electrons generated can leave the buildup layer, enter into the adjacent x-ray converting layer, and interact with the scintillator or photoconductor material to generate visible photons or electron-hole pairs. In general, the thickness of the buildup layer 108 made from a higher Z material may be smaller as the electrons generated in the buildup layer have a limited travelling length before they are recombined inside the material. In some embodiments, the buildup layer 108 may be made of copper (Cu). Copper is relatively inexpensive and can be made in large flat sheets to match with the scintillator layer 102.

In one specific embodiment, the imaging device 100 may provide an imaging area of 30 cm×40 cm. The substrate 106 may be made of glass and have a thickness of about 0.7 mm. The detector array 104 may include a-Si TFTs and photodiodes and have a thickness of about 2 microns. The x-ray converting layer 102 may include Lanex scintillator and have a thickness ranging from about 0.1 mm to about 1 mm. The buildup layer 108 may be made of copper and have a thickness of about 1 mm. It should be noted that the details of specific components and dimensions etc. are provided for illustration and understanding of embodiments of the disclosure. These specific details need not be employed to practice embodiments of the disclosure.

In operation, the imaging device 100 may be used as a "universal" imager, for imaging with a wide range of energy including both MV imaging and kV imaging. In kV imaging, incident kV x-ray photons may pass through the substrate 106 and detector array 104, and enter into the x-ray converting layer 102 to interact with e.g. a scintillator to generate visible light. The light produced may then be detected by the detector array 104. The imaging device 100 is shown in FIG. 1 in a reverse geometry where x-rays traverse the detector array 104 before propagating in the x-ray converting layer 102. One of the advantages of having a reverse geometry is that in a reverse geometry, the side or portion of the scintillator proximal to the detector array 104 absorbs x-ray photons first. As such, the intensity of light produced by the scintillator may be the greatest near the detector elements. Light collection by the detector array 104 may be more efficient, thereby increasing the signal to noise ratio and spatial resolution of digitized images. Further, the thickness of the scintillator may no longer be critical in x-ray absorption to produce sufficient light for imaging. In a forward geometry in contrast, the side or portion of the scintillator distal to the detector array would absorb x-ray photons first. To reach the detector elements, the light produced by the scintillator at the side distal to the detector elements would have to travel across the thickness of the scintillator. In some cases, 60% or more of the light may not exit the scintillator and hence do not contribute image signals. This may lower the signal to noise ratio and spatial resolution in the images.

Returning to FIG. 1, in MV imaging, a small amount of incident MV x-ray photons, e.g. about 1-2%, may interact with the x-ray converting layer 102, thereby producing e.g. visible light which may be detected by the detector array 104. Due to the high penetrating property of MV x-rays, the majority of incident MV x-ray photons, e.g. about 98-99%, may pass through the x-ray converting layer 102 without having interactions. The buildup layer 108 may absorb and interact with at least a portion of the MV photons and generate a high energy electron shower. While it is not intended to limit the embodiments of this disclosure to any particular theory, it is believed that the generated electrons move in different directions from the interaction point and many of the electrons may reach the adjacent x-ray converting layer 102. The high energy electrons may interact with the scintillator or photoconductor material to generate additional visible light photons or electron-hole pairs. One high energy electron may generate hundreds or thousands of visible photons depending on the energy of the electron. As a result, the contrast resolution and detective quantum efficiency (DQE) of the imaging device 100 may be improved by using the buildup layer 108, since additional MV x-ray photons, rather than being wasted, may be absorbed and contribute to image acquisition.

Figure 2:
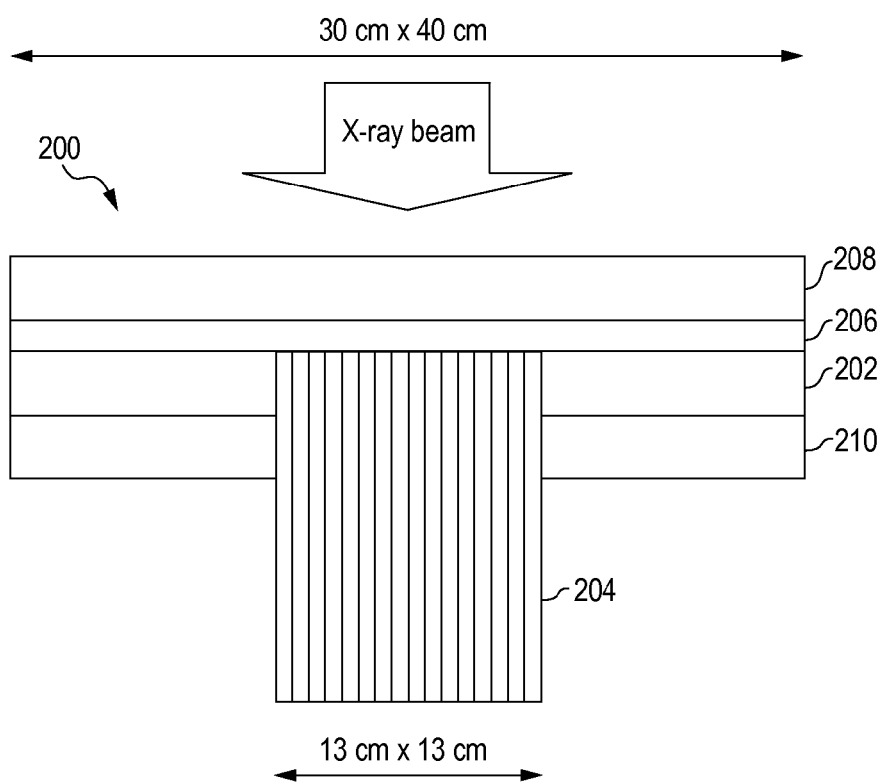
FIG. 2 is a schematic representation of an x-ray imaging device according to some other embodiments of this disclosure.

FIG. 2 schematically shows an exemplary x-ray imaging device 200 according to some alternative embodiments of the disclosure. The imaging device 200 may include a first x-ray converting layer 202, a second x-ray converting layer 204, and a detector array 206 over a substrate 208. The imaging device 200 may be configured to have a reverse geometry, i.e., the detector array 206 is situated between the first/second x-ray converting layers 202, 204 and the x-ray source (not shown). The imaging device 200 may also include a buildup layer 210 behind the first x-ray converting layer 202 relative to the source.

The first x-ray converting layer 202 and the second x-ray converting layer 204 may be configured such that the second x-ray converting layer 204 is surrounded by the first x-ray converting layer 202. For instance, the first x-ray converting layer 202 may have a cutout to allow the second x-ray converting layer 204 or at least a portion of the second x-ray converting layer 204 to be disposed therein. The cutout may be in the center region of the first x-ray converting layer 202. Alternatively, the cutout may be in any other location such as in a location proximal to a side of the first x-ray converting layer 202. In some alternative embodiments, instead of being disposed in a cutout in the first x-ray converting layer 202, the second x-ray converting layer 204 may be disposed side by side with the first x-ray converting layer 202.

The thicknesses of the first and second x-ray converting layers 202, 204 may be different. For instance, the thickness of the second x-ray converting layer 204 may be significantly greater than the thickness of the first x-ray converting layer 202. In alternative embodiments, the thicknesses of the first and second x-ray converting layers 202, 204 may be same. By way of example, in one specific embodiment, the first x-ray converting layer 202 may have a thickness of about 1 mm, and the second x-ray converting layer 204 may have a thickness of about 10-20 mm, which is about 10-20 times of the thickness of the first x-ray converting layer 202. The second x-ray converting layer 204 may define an imaging area of 13 cm×13 cm. Collectively, the first and second x-ray converting layers 202, 204 may define an imaging area of 30 cm×40 cm for the imaging device 200. It should be noted that the details of specific dimensions are provided for illustration and understanding of the disclosure. These specific details need not be employed to practice embodiments of the disclosure.

The first and second x-ray converting layer 202, 204 may each include a scintillator material. Suitable scintillator materials that can be used for the first and second x-ray converting layers may respectively include cesium iodide (CsI), cadmium tungstate ($CdWO_4$), bismuth germanate ($Bi_4Ge_3O_{12}$ or BGO), and gadolinium oxisulfide ($Gd_2O_2S$:Tb, or "Lanex"), etc.

In some embodiments, the second x-ray converting layer 204 may comprise a scintillator that has a columnar structure. For example, the scintillator of the second x-ray converting layer 204 may include cesium iodide (CsI), which can be grown to form a plurality of long needle-like "towers" or columns. The columnar structure of the scintillator may act as light pipes, channeling light emitted within them toward the detector elements, thereby reducing the lateral spread of light. In some embodiments, the long, side surfaces of the scintillator crystal columns may be covered with an optical reflecting material such as Toray or Vicuity. Such a configuration may provide better MV x-ray absorption (10-20%) and improve the detective quantum efficiency (DQE) of the imaging device. DQE is a measure of the fidelity of an imaging device in capturing and transferring image information. The range of DQE is 0<DQE<1, where the value of 1 implies that all the image information in the incoming X-rays is captured and no noise is added.

The detector array 206 may be similar to the detector array 104 of the imaging device 100 as described above in connection with FIG. 1. The detector array 206 may have a first detector region coupled to the first x-ray converting layer 202 and a second detector region coupled to the second x-ray converting layer 204. The detector array 206 may include a plurality of detector elements each of which may include a photodiode and a switching element such as a thin film transistor (TFT), an organic transistor, metal oxide transistor, charge coupled device (CCD), Complementary Metal Oxide Semiconductor (CMOS) circuit, and/or switching diodes. Optionally the detector elements can contain further components for signal or charge buffering and amplification. Each detector element may form a pixel of the X-ray image generated using the detector array 206. The detector array 206 may also include a pixel access circuit (not shown), which may be configured to access the detector elements and reads the electric signals from the detectors.

The substrate 208 may be similar to the substrate 106 of the imaging device 100 as described above in connection with FIG. 1. In some embodiments, the substrate 208 may be a glass substrate having low attenuation of x-rays. This may allow x-rays having kilovoltage energy levels to pass through the substrate 208 to interact with the x-ray converting material in the imaging device.

By way of example, in one specific embodiment, the imaging device 200 shown in FIG. 2 may include a glass substrate 208 having a thickness of about 0.7 mm. The detector array 206 may include a-Si TFTs and photodiodes and have a thickness of about 2 microns. The first x-ray converting layer 202 may include Lanex scintillator and have a thickness ranging from about 0.1 mm to about 1 mm. The second x-ray converting layer 204 may include CsI scintillator and have a thickness of about 10-20 mm. The CsI scintillator may have a columnar structure and the side surfaces of the columns or towers may be covered with a reflective material such as Toray or Vicuity. The buildup layer 210 may be made of copper and have a thickness of about 1 mm. It should be noted that the details of specific components and dimensions etc. are provided for illustration and understanding of the disclosure. These specific details need not be employed to practice embodiments of the disclosure.

The imaging device 200 shown in FIG. 2 may be used as a "universal" imager, for both MV imaging and kV imaging. In kV imaging, incident kV x-ray photons may pass through the substrate 208 and detector array 206, and enter into both the first and second x-ray converting layers 202, 204 to interact with e.g. first and second scintillators to produce visible light. The visible light produced may be detected by the detector array 206. In one specific embodiment shown in FIG. 2, the second x-ray converting layer 204 may be much thicker than the first x-ray converting layer 202. Because the imaging device 200 may be configured in a reverse geometry, i.e., the detector array 206 is situated between the x-ray source (not shown) and the first/second x-ray converting layers 202, 204, the thinner first scintillator 202 and the thicker second scintillator 204 may contribute roughly similar amounts of visible light that the detector array 206 may convert into electrical signals. The visible light generated in the thicker second scintillator 204 does not need to travel across the thickness of the second x-ray converting layer 204 before reaching the detector array 206, which otherwise would in a forward geometry in which case, some light may not even penetrate through the thicker second scintillator and contribute image signals.

In MV imaging, the thicker second x-ray converting layer 204 may have more interactions with MV x-ray photons as compared with the thinner first x-ray converting layer 202, partially due to the greater thickness and/or columnar structure of the second scintillator layer 204. In the region of the first x-ray converting layer 202 surrounding or adjacent to the second x-ray converting layer 204, the majority of MV photons, e.g. about 98-99%, may pass through without having interactions due to the high penetrating property of MV x-rays. The buildup layer 210 behind the first converting layer 202 may generate a shower of high energy electrons. A large portion of the high-energy electrons generated may be projected in a direction substantially opposite to the incident x-ray photons and enter into the first converting layer 202. The high energy electrons may interact with the scintillator or photoconductor of the first converting layer 202, and produce additional visible light or electron-hole pairs, which may then be detected by the detector array 206.

By way of example, the CsI scintillator in the thicker second x-ray converting layer 204 may interact with MV photons roughly 10 times more than the Lanex/Cu of the thinner first x-ray converting layer 202 does. As a result, in MV imaging, the imaging region corresponding to the second x-ray converting layer 204 (13 cm×13 cm) may provide images with much better resolution and much lower noise. The imaging region corresponding to the first x-ray converting layer 202 may provide for a full size MV image (e.g. 30 cm×40 cm) but without the cost of a larger area of thick CsI scintillator.

Figure 3:
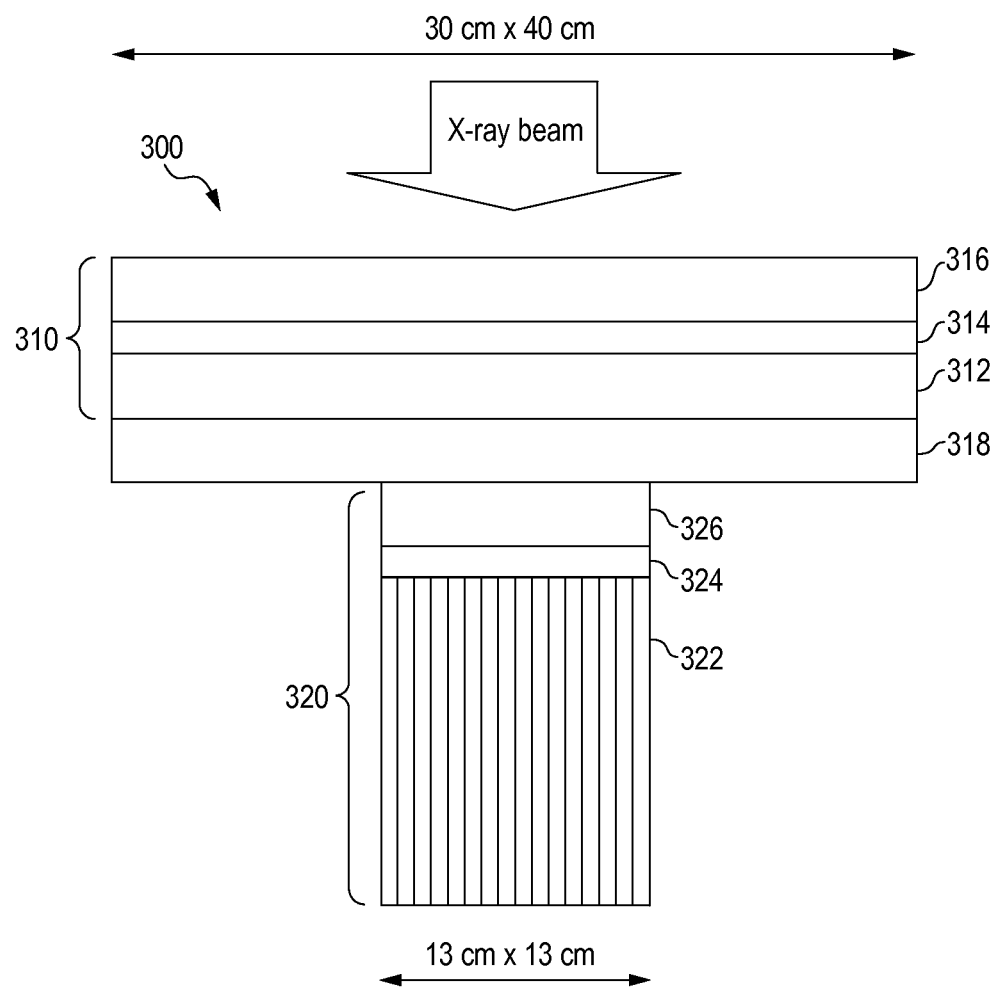
FIG. 3 is a schematic representation of an x-ray imaging device according to some further embodiments of this disclosure.

FIG. 3 schematically shows an exemplary x-ray imaging device 300 according to some further embodiments of the disclosure. The imaging device 300 may include a first imaging unit 310 and a second imaging unit 320 that are coupled in series in the direction of x-ray propagation. Between the first imaging unit 310 and the second imaging unit 320 may be a buildup layer 318. Alternatively, the layer 318 between the first imaging unit 310 and the second imaging unit 320 may be a light reflecting layer.

The first imaging unit 310 may include a first x-ray converting layer 312 and a first detector array 314 over a first substrate 316. The first imaging unit 310 may be configured to have a reverse geometry, i.e., the first detector array 314 is situated between the first x-ray converting layer 312 and the x-ray source (not shown). The second imaging unit 320 may include a second x-ray converting layer 322 and a second detector array 324 over a second substrate 326. The second imaging unit may be configured to have a reverse geometry, i.e., the second detector array 324 is situated between the second x-ray converting layer 322 and the x-ray source (not shown).

The first x-ray converting layer 312 may include a first scintillator material. By way of example, suitable materials that can be used as the first scintillator include but are not limited to: gadolinium oxisulfide ($Gd_2O_2S$:Tb, or "Lanex"), cadmium tungstate ($CdWO_4$), bismuth germanate ($Bi_4Ge_3O_{12}$ or BGO), and cesium iodide (CsI), etc.

The first detector array 314 may include a plurality of detector elements configured to generate electric signals in response to the light produced in the first scintillator 312. The first detector array 314 may be similar to the detector array 206 of the imaging device 200 as described above in connection with FIG. 2.

The first substrate 316 may be similar to the substrate 208 of the imaging device 200 as described above in connection with FIG. 2. In some embodiments, the first substrate 316 may be a glass substrate having low attenuation of x-rays. This may allow x-rays having kilovoltage energy levels to pass through the first substrate 316 to interact with the x-ray converting material in the imaging device.

By way of example, the first imaging unit 310 may provide an imaging area of 30 cm×40 cm. The first substrate 316 may be made of glass and have a thickness of about 0.7 mm. The first detector array 314 may include a-Si TFTs and photodiodes and have a thickness of about 2 microns. The first x-ray converting layer 312 may include Lanex scintillator and have a thickness ranging from about 0.1 mm to about 1 mm. It should be noted that the details of specific components and dimensions etc. are provided for illustration and understanding of the disclosure. These specific details need not be employed to practice embodiments of the disclosure.

Returning to FIG. 3, the second x-ray converting layer 322 may include a second scintillator material. Suitable scintillator materials that can be used in the second x-ray converting layer 322 may include cesium iodide (CsI), cadmium tungstate ($CdWO_4$), bismuth germanate ($Bi_4Ge_3O_{12}$ or BGO), and gadolinium oxisulfide ($Gd_2O_2S$:Tb, or "Lanex"), etc.

In some embodiments, the second scintillator 322 may be different from the first scintillator 312. For example, the second scintillator 322 may be cesium iodide (CsI) whereas the first scintillator 312 may be Lanex. Alternatively, the second scintillator 322 may be same as the first scintillator 312. The thickness of the second scintillator 322 may be significantly greater than the thickness of first scintillator 312 to allow more interactions of MV x-ray photons with the second scintillator 322.

In some embodiments, the second scintillator 322 may have a columnar structure. For example, the second scintillator 322 may include cesium iodide (CsI), which can be grown to form a plurality of long needle-like "towers" or columns. The columnar structure of the scintillator may act as light pipes, channeling light emitted within them toward the detector elements, thereby reducing the lateral spread of light. In some embodiments, the long, side surfaces of the scintillator crystal columns may be covered with an optical reflecting material such as Toray or Vicuity.

The second detector array 324 may be similarly constructed as the first detector array 314. The second detector array 324 may include a plurality of detector elements each of which may include a photodiode and a switching element such as a thin film transistor (TFT), an organic transistor, metal oxide transistor, charge coupled device (CCD), Complementary Metal Oxide Semiconductor (CMOS) circuit, and/or switching diodes. Optionally the detector elements can contain further components for signal or charge buffering and amplification. Each detector element may form a pixel of the x-ray image generated. The second detector array 324 may also include a pixel access circuit (not shown), which may be configured to access the detector elements and reads the electric signals from the detectors.

By way of example, the second imaging unit 320 may provide an imaging area smaller than the imaging area provided by the first imaging unit 310. Alternatively, the second imaging unit 320 may provide an imaging area same as the imaging area provided by the first imaging unit 310, depending on the applications. In one specific embodiment, the second imaging unit 320 provides an imaging area of 13 cm×13 cm. The second substrate 326 may be made of glass and has a thickness of about 0.7 mm. The second detector array 324 may include a-Si TFTs and photodiodes and have a thickness of about 2 microns. The second x-ray converting layer 322 may include CsI scintillator and have a thickness of about 10-20 mm. The CsI scintillator may have a columnar structure and the side surfaces of the columns or towers may be covered with a reflective material such as Toray or Vicuity. It should be noted that the details of specific components and dimensions etc. are provided for illustration and understanding of the disclosure. These specific details need not be employed to practice embodiments of the disclosure.

Referring to FIG. 3, the imaging device 300 may be used as a "universal" imager, for both MV imaging and kV imaging. In kV imaging, almost all of kV x-ray photons would be absorbed in the first imaging unit 310, which contribute image signals. As a result, the second imaging unit 320 would make no contribution to the detected image signals. In MV imaging, a small amount of MV x-ray photons, e.g. about 1-2%, would interact with the first imaging unit 310 and contribute image signals. Since about only 1-2% MV x-ray photons would be absorbed by the first imaging unit 310, there is negligible amount of degradation in the image signals that would be produced by the second imaging unit 320 in MV imaging. The majority of MV x-ray photons, e.g. about 98-99%, would pass through the first imaging unit 310. The MV x-ray photons that penetrate through the first imaging unit 310 may interact with the second imaging unit 320 and produce image signals. Because the thicker CsI scintillator of the second x-ray converting layer 322 may interact with MV photons roughly 10 times more than Lanex scintillator in the first x-ray converting layer 312, the second imaging unit 320 may provide images with much better resolution and much lower noise in MV imaging. The images acquired by the first and second imaging units 310, 320 may be combined or processed using various image processing algorithms known in the art.

Figure 4:
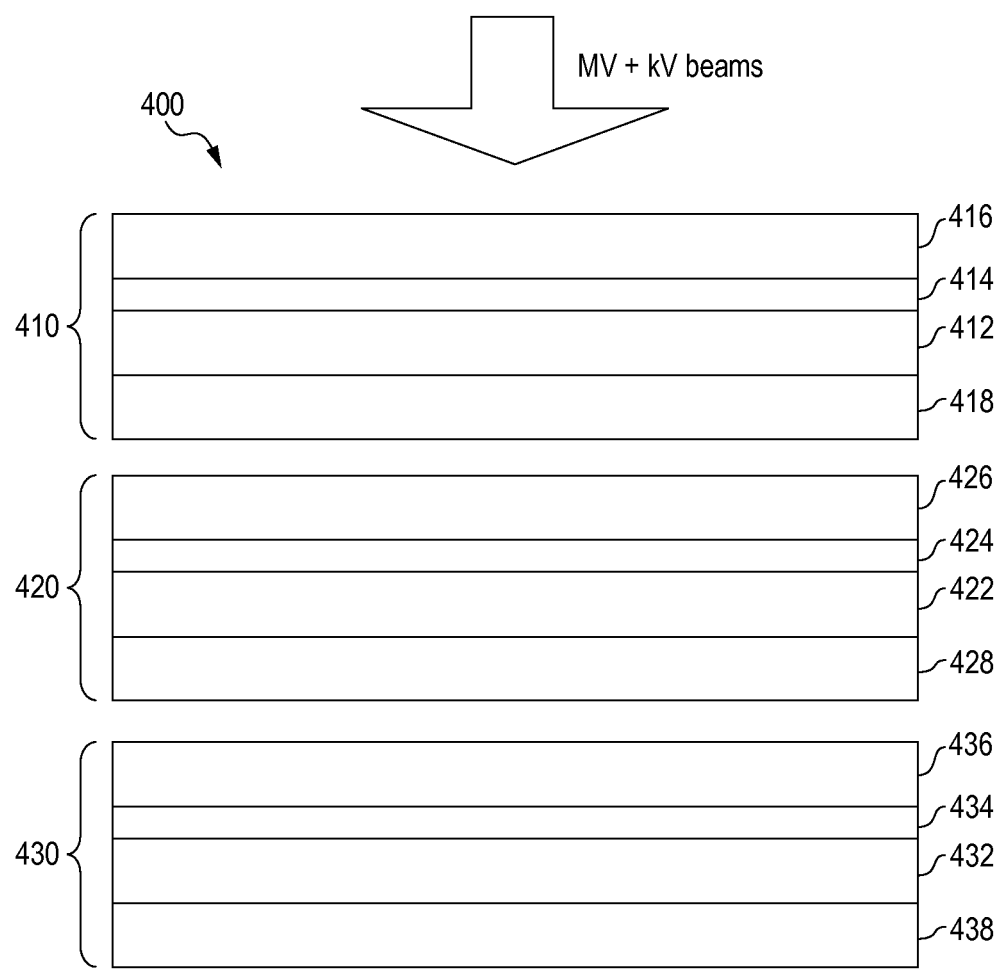
FIG. 4 is a schematic representation of an x-ray imaging device according to some alternative embodiments of this disclosure.

FIG. 4 schematically shows an alternative x-ray imaging device 400 according to some embodiments of the disclosure. The imaging device 400 may include a plurality of imaging layers or imaging units that are coupled in series in the direction of x-ray propagation. Each of the imaging units may include an x-ray converting layer configured to convert x-ray photons to light or electrical charges and a detector array configured to detect the light or electrical charges converted from the x-ray photons. Each of the imaging units may also include a buildup layer behind the x-ray converting layer. For example, FIG. 4 shows an exemplary x-ray imaging device 400 comprising three imaging layers or imaging units 410, 420, 430. The first imaging unit 410 may include an x-ray converting layer 412, a detector array 414, a substrate 416, and a buildup layer 418. The second imaging unit 420 may include an x-ray converting layer 422, a detector array 424, a substrate 426, and a buildup layer 428. The third imaging unit 430 may include an x-ray converting layer 432, a detector array 434, a substrate 436, and a buildup layer 438. It will be appreciated that the x-ray imaging device 400 may include two imaging unites or more than three imaging units.

At least one of the imaging units 410, 420, and 430 may have a reverse geometry, i.e., the detector array is situated between the x-ray converting layer of the imaging unit and the x-ray source. For example, the first imaging unit 410 may be configured to have a reverse geometry. Alternatively, each of the plurality of the imaging units 410, 420, and 430 may be configured to have a reverse geometry. The first imaging unit 410 may be configured primarily for kV imaging. Since most of kV x-rays would be absorbed by the x-ray converting layer 412 and the buildup layer 418 in the first imaging unit 410, the second and third imaging units 420, 430 may be configured primarily for MV imaging.

The configuration and construction of some or all of the imaging units 410, 420, 430 may be same. Alternatively, the configuration and construction of some or all of the imaging units 410, 420, and 430 may be different. For example, the first imaging unit 410 may be made sensitive to x-rays having lower energies, whereas the second and third imaging units 420, 430 may be made sensitive to x-rays having higher energies progressively e.g. by using a filter between the imaging units. In some embodiments, the first imaging unit 410 may be made sensitive to both kV and MV energies. The x-ray converting layers, detector arrays, substrates, and buildup layers in the imaging units 410, 420, and 430 may be similar, respectively, to the x-ray converting layer 102, detector array 104, substrate 106, and buildup layer 108 of the imaging device 100 described above in connection with FIG. 1.

In some alternatively embodiments, the imaging device 400 may be configured such that the first imaging unit 410 may have a reverse geometry whereas the remaining imaging units e.g. the second and third imaging units 420, 430 may have a forward geometry.

In some embodiments, at least one of the plurality of imaging units 410, 420, and 430 may include a scintillator as an x-ray converting layer, and at least one of the plurality of imaging units 410, 420, and 430 may include a photoconductor as an x-ray converting layer. In other words, the imaging device 400 may include both scintillator x-ray converting layer(s) and photoconductor x-ray converting layer(s) in different imaging units.

In one specific embodiment, the imaging device 400 may include a plurality of identical imaging units 410, 420, 430. Each of the substrates 416, 426, 436 may be made of glass and have a thickness of about 0.7 mm. Each of the detector arrays 414, 424, 434 may include a-Si TFTs and photodiodes and have a thickness of about 2 microns. Each of the x-ray converting layers 412, 422, 432 may include a scintillator material and have a thickness ranging from about 0.1 mm to about 1 mm. Each of the buildup layers 418, 428, 438 may be made of copper and have a thickness of about 1 mm. It should be noted that the details of specific components and dimensions etc. are provided for illustration and understanding of embodiments of the disclosure. The number of imaging layers or units may be two or more than three. The thickness of the scintillator layer may range from sub mm to a few mm and even further up to a few cm if columnar or pixellated scintillator structures are used where the light spread may be blocked from pixel to pixel by light barrier layers between the columns or pixels. The thickness of the buildup layer may also range from sub mm to a few mm depending on the material and on the x-ray energies in applications.

Figure 5:
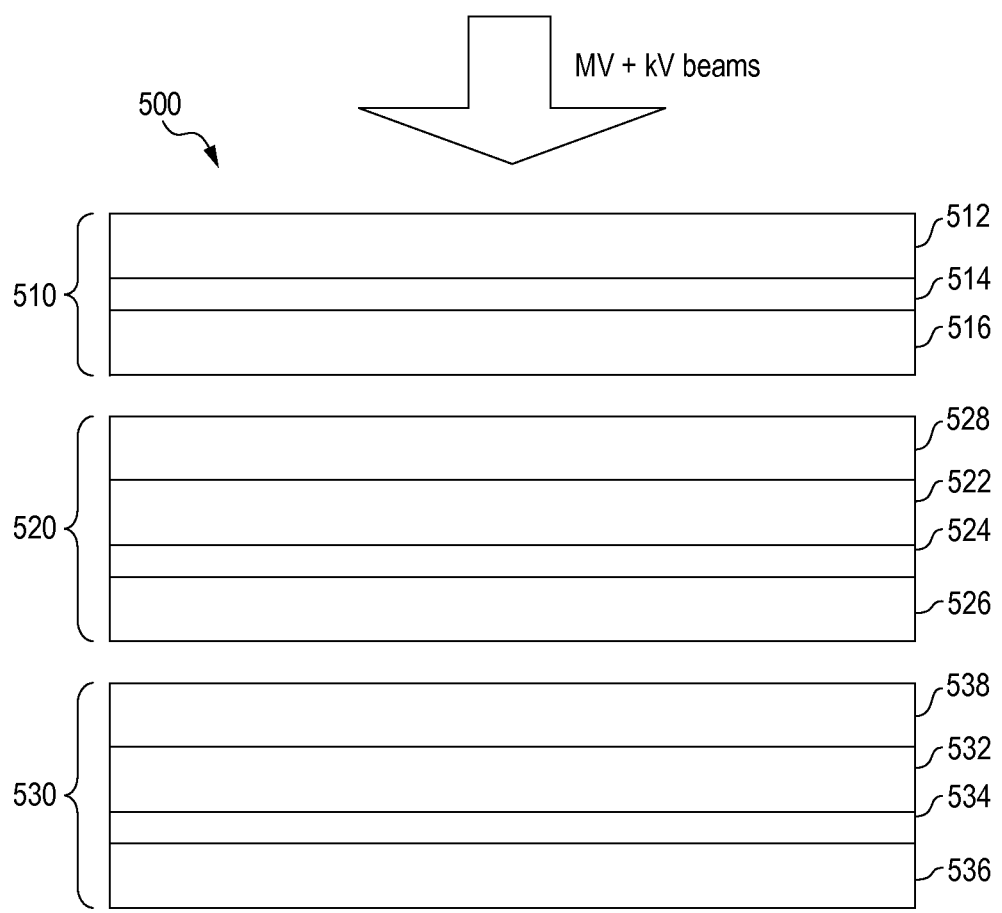
FIG. 5 is a schematic representation of an x-ray imaging device according to some alternative embodiments of this disclosure.

FIG. 5 schematically shows an alternative x-ray imaging device 500 according to some further embodiments of the disclosure. The imaging device 500 may include a plurality of imaging layers or imaging units each of which may include an x-ray converting layer and a detector array. For illustration purpose, FIG. 5 shows that the x-ray imaging device 500 comprises three imaging layers or imaging units 510, 520, 530. The number of imaging layers or imaging units may be two or more than three. The first imaging unit 510 may include an x-ray converting layer 512, a detector array 514, and a substrate 516. The second imaging unit 520 may include an x-ray converting layer 522, a detector array 524, a substrate 526, and a buildup layer 528. The third imaging unit 530 may include an x-ray converting layer 532, a detector array 534, a substrate 536, and a buildup layer 538.

As compared with the multi-layered imaging device 400 shown in FIG. 4, each of the imaging units 510, 520, and 530 of the imaging device 500 shown in FIG. 5 may have a forward geometry, i.e., an x-ray converting layer in an imaging unit is situated between the x-ray source and an detector array in the imaging unit. Further, each of imaging units 520, 530 may include a buildup layer 528, 538 on top of the imaging units 520, 530 respectively, except for the first imaging unit 510 which does not include a buildup layer. This configuration of the imaging device 500 may allow a plurality of imaging units having a forward geometry to be coupled in series and used for both MV and kV imaging, because kV x-rays are not blocked by a buildup layer and may be detected by at least the first imaging unit 510. Without a buildup layer in the first imaging unit 510, the detection efficiency of the first imaging unit 510 in MV imaging may be decreased for lack of contribution of the buildup layer. However, the remaining imaging units 520, 530 behind the first imaging unit 510 may provide additional boost in the resulting DQE in MV imaging.

In some embodiments, at least one of the plurality of imaging units 510, 520, and 530 may include a scintillator as an x-ray converting layer, and at least one of the plurality of imaging units 510, 520, and 530 may include a photoconductor as an x-ray converting layer. In other words, the imaging device 500 may include both scintillator x-ray converting layer(s) and photoconductor x-ray converting layer(s) in different imaging units.

The test results of exemplary imaging devices described in various embodiments of this disclosure show that the disclosed imaging devices can be used as a "universal" imager, for both MV and kV imaging with improved device performance. In a test, the imaging device having a reverse geometry (REV) as shown in FIG. 1 was illuminated with 6 MV x-rays and 120 kV x-rays respectively. A conventional imaging device having a forward geometry (FWD) was also illuminated with 6 MV x-rays and 120 kV x-rays respectively for comparison purpose. The resolution (MTF) and the detective quantum efficiency (DQE) of the disclosed imaging device (REV) and the conventional imaging device (FWD) were measured and compared.

Figure 6:
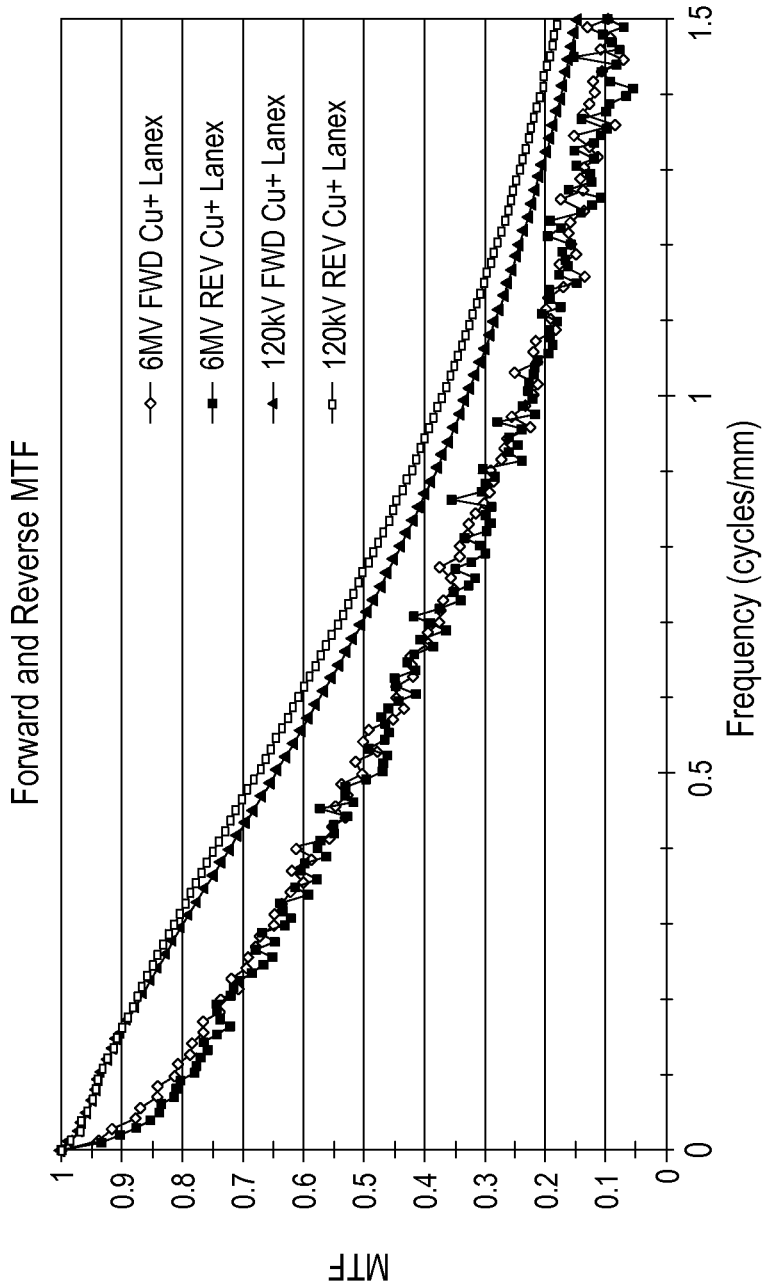
FIG. 6 shows the resolution of an exemplary imaging device of this disclosure having a reverse geometry (REV) and of a conventional imaging device having a forward geometry (FWD) in MV and kV imaging.

FIG. 6 shows the resolution (MTF) test results in both MV and kV imaging. FIG. 6 shows that under illumination of 6 MV x-ray radiation, the disclosed imaging device (REV) shown in FIG. 1 had about the same resolution as that of the conventional imaging device (FWD). Under illumination of 120 kV x-ray radiation, the disclosed imaging device (REV) had a better resolution than that when the imaging device was illuminated with 6 MV x-ray radiation. Further, under illumination of 120 kV x-ray radiation, the disclosed imaging device (REV) had a better resolution than that of the conventional imaging device (FWD).

Figure 7A:
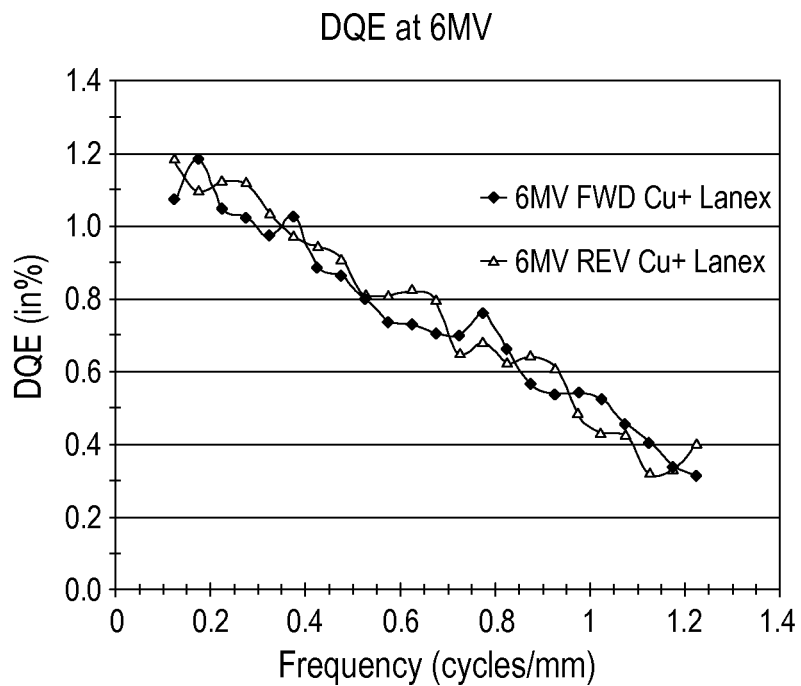
FIG. 7A shows the detective quantum efficiency (DQE) of an exemplary imaging device of this disclosure having a reverse geometry (REV) and of a conventional imaging device having a forward geometry (FWD) in MV imaging.
Figure 7B:
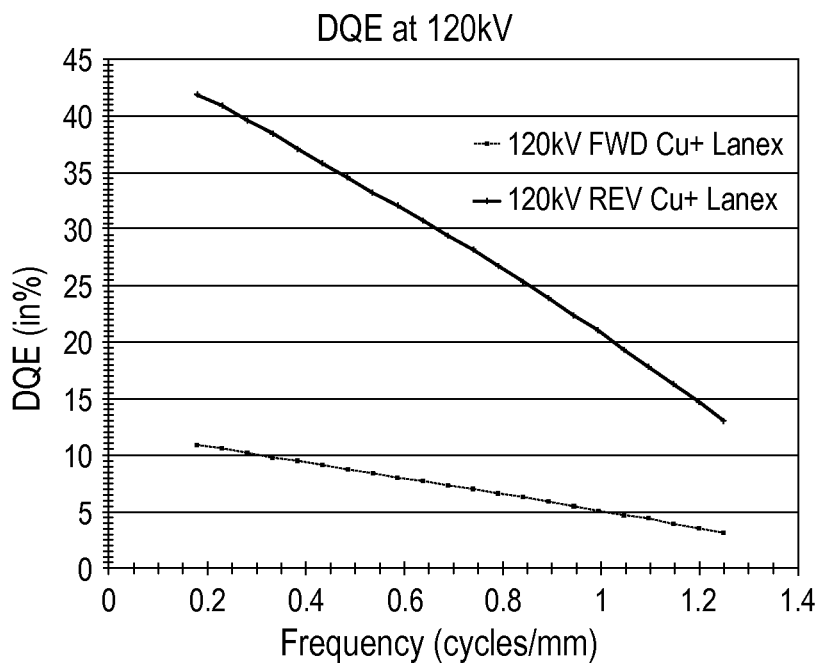
FIG. 7B shows the detective quantum efficiency (DQE) of an exemplary imaging device of this disclosure having a reverse geometry (REV) and of a conventional imaging device having a forward geometry (FWD) in kV imaging.

FIGS. 7A-7B show the detective quantum efficiency (DQE) test results in both MV and kV imaging. FIG. 7A shows that under illumination of 6 MV x-ray radiation, the disclosed imaging device (REV) shown in FIG. 1 had about the same DQE as that of the conventional imaging device (FWD). At 6 MV energy, the additional buildup layer (Cu) improved the DQE by about a factor of two compared to using the Lanex scintillator only. Therefore, a buildup layer is beneficial to an imaging device having either a reverse geometry or a forward geometry, as shown in FIG. 7A.

FIG. 7B shows that under illumination of 120 kV x-ray radiation, the disclosed imaging device (REV) had a DQE about 4 times higher than that of the conventional imaging device (FWD). While it is not intended to limit the embodiments of this disclosure to any particular theory, it is believed that at 120 kV X-ray energy, the buildup layer in the conventional imaging device (FWD) absorbed most of the x-rays without providing the high energy electron shower that might contribute to the imaging quality at 6 MV. As a result, a much attenuated x-ray beam might reach the underneath scintillator layer, providing limited signal and thus a low DQE. When illuminating the disclosed imaging device (REV), the kV x-rays passed through the glass substrate and a-Si detector array first. As the glass substrate and a-Si detector array had very little absorption of x-rays, most of the kV x-rays might reach the underneath scintillator layer, generating much more signal and thus a much better DQE.

FIGS. 7A and 7B show that in MV imaging, the DQE did not decrease in the disclosed imaging device (REV) as compared to the conventional imaging device (FWD). However, in kV imaging, the DQE was much better in the disclosed imaging device (REV) as compared to the conventional kV-only imager having a forward geometry. Accordingly, the imaging devices disclosed in this application may be used for both kV and MV imaging.

Exemplary embodiments of imaging devices suitable for both kV and MV imaging are described. Those skilled in the art will appreciate that various modifications may be made within the spirit and scope of the disclosure. For example, the disclosed methods may also be implemented in photoconductor or semiconductor based x-ray imager. The photoconductor may include mercuric iodide ($HgI_2$), lead iodide ($PbI_2$), bismuth iodide ($BiI_3$), cadmium zinc telluride (CdZnTe), amorphous selenium (a-Se), etc., which may be configured to generate electron-hole pairs or charges in response to x-ray radiation. The generated electrons and holes may be collected by an array of charge-collection electrodes and detected by a detector array. A buildup layer may be used in conjunction with the photoconductor layer to increase x-ray absorption. A high energy electron shower, which may be generated in the buildup layer through interaction with high energy x-rays, may enter the photoconductor layer and generate additional electron-hole pairs. The so generated electron-hole pairs, together with the ones generated directly by x-ray absorption in the photoconductor, may be collected in each pixel of the detector and read out by the TFT array. Various other detection schemes are possible and can be used in embodying the principle of the disclosure. All these or other variations and modifications are contemplated by the inventors and within the scope of the disclosure.

The invention claimed is:

1. An x-ray imaging device, comprising:
   a detector array;
   an x-ray converting layer coupled to the detector array, wherein the detector array and the x-ray converting layer are configured such that x-rays traverse the detector array before propagating in the x-ray converting layer; and a buildup layer behind the x-ray converting layer in a direction of x-ray propagation.

2. The x-ray imaging device of claim 1 wherein the buildup layer is made from a material comprising copper (Cu), aluminum (Al), beryllium (Be), titanium (Ti), lead (Pb), tantalum (Ta), tungsten (W), silver (Ag), gold (Au), palladium (Pd), or Platinum (Pt), or an alloy thereof.

3. The x-ray imaging device of claim 1 wherein the buildup layer comprises copper.

4. The x-ray imaging device of claim 1 wherein the x-ray converting layer comprises a scintillator configured to produce light by interacting with x-rays.

5. The x-ray imaging device of claim 1 wherein the x-ray converting layer comprises a photoconductor configured to produce electron-hole pairs by interacting with x-rays.

6. An x-ray imaging device, comprising:
a detector array having a first detector region and a second detector region;
a first x-ray converting layer coupled to the first detector region of the detector array; and
a second x-ray converting layer coupled to the second detector region of the detector array;
wherein the first x-ray converting layer comprises a first scintillator having a first thickness, and the second x-ray converting layer comprises a second scintillator having a second thickness greater than the first thickness.

7. The x-ray imaging device of claim 6 wherein the second scintillator has a columnar structure or is pixellated.

8. The x-ray imaging device of claim 7 wherein the second scintillator comprises cesium iodide (CsI).

9. An x-ray imaging device, comprising:
a detector array having a first detector region and a second detector region;
a first x-ray converting layer coupled to the first detector region of the detector array; and
a second x-ray converting layer coupled to the second detector region of the detector array,
wherein the x-ray imaging device is configured such that x-rays traverse the detector array before propagating in the first and second x-ray converting layers.

10. The x-ray imaging device of claim 9 further comprising a buildup layer behind the second x-ray converting layer in a direction of x-ray propagation.

11. The x-ray imaging device of claim 10 wherein the buildup layer is made from a material selected from the group consisting of copper (Cu), aluminum (Al), beryllium (Be), titanium (Ti), lead (Pb), tantalum (Ta), tungsten (W), silver (Ag), gold (Au), palladium (Pd), Platinum (Pt), and their alloys or mixture.

12. The x-ray imaging device of claim 10 wherein the buildup layer comprises copper.

13. The x-ray imaging device of claim 10 wherein the first and second x-ray converting layers are configured such that the second x-ray converting layer is in a center of and surrounded by the first x-ray converting layer.

14. An x-ray imaging device, comprising:
a first imaging unit comprising a first x-ray converting layer and a first detector array; and
a second imaging unit comprising a second x-ray converting layer and a second detector array; wherein
the first imaging unit and the second imaging unit are coupled in series in a direction of x-ray propagation;

the first imaging unit is configured such that x-rays traverse the first detector array before propagating in the first x-ray converting layer; and
the second imaging unit is configured such that x-rays traverse the second detector array before propagating in the second x-ray converting layer.

15. The x-ray imaging device of claim 14 further comprising a buildup layer between the first and second imaging units.

16. The x-ray imaging device of claim 14 further comprising a light reflecting layer between the first and second imaging units.

17. The x-ray imaging device of claim 14 wherein the first x-ray converting layer comprises a first scintillator having a first area and a first thickness, and the second x-ray converting layer comprises a second scintillator having a second area and a second thickness.

18. The x-ray imaging device of claim 17 wherein the second thickness is greater than the first thickness.

19. The x-ray imaging device of claim 18 wherein the second area is smaller than the first area.

20. The x-ray imaging device of claim 18 wherein the second area is same as the first area.

21. The x-ray imaging device of claim 18 wherein the second scintillator has a columnar structure or is pixellated.

22. The x-ray imaging device of claim 21 wherein the second scintillator comprises cesium iodide (CsI).

23. An x-ray imaging device, comprising:
a first imaging unit comprising a first detector array, a first x-ray converting layer, and a first buildup layer; and
a second imaging unit comprising a second detector array, a second x-ray converting layer, and a second buildup layer;
wherein the first and second imaging units are configured such that x-rays traverse the first imaging unit before propagating in the second imaging unit; and
wherein the first imaging unit is configured such that x-rays traverse the first detector array before propagating in the first x-ray converting layer, and the first buildup layer is disposed behind the first x-ray converting layer in a direction of x-ray propagation.

24. The x-ray imaging device of claim 23, wherein the second imaging unit is configured such that x-rays traverse the second detector array before propagating in the second x-ray converting layers, and the second buildup layer is disposed behind the second x-ray converting layer in a direction of x-ray propagation.

25. The x-ray imaging device of claim 23, wherein the second imaging unit is configured such that x-rays traverse the second x-ray converting layers before propagating in the second detector array.

26. The x-ray imaging device of claim 23 further comprising one or more additional imaging units coupled to the second imaging unit.

27. The x-ray imaging device of claim 26 wherein at least one of the first imaging unit, the second imaging unit, and the one or more additional imaging units comprises a scintillator as an x-ray converting layer, and at least one of the first imaging unit, the second imaging unit, and the one or more additional imaging units comprises a photoconductor as an x-ray converting layer.

28. An x-ray imaging device, comprising:
a first imaging unit comprising a first detector array and a first x-ray converting layer; and
a second imaging unit comprising a second detector array, a second x-ray converting layer, and a buildup layer;

wherein the first and second imaging units are configured such that x-rays traverse the first imaging unit before propagating in the second imaging unit; and wherein the first imaging unit is configured such that x-rays traverse the first detector array before propagating in the first x-ray converting layer.

29. The method of claim 28, wherein the second imaging unit is configured such that x-rays traverse the second x-ray converting layers before propagating in the second detector array, and the buildup layer is disposed before the second x-ray converting layer.

30. The x-ray imaging device of claim 28 further comprising one or more additional imaging units coupled to the second imaging unit.

31. The x-ray imaging device of claim 30 wherein at least one of the first imaging unit, the second imaging unit, and the one or more additional imaging units comprises a scintillator as an x-ray converting layer, and at least one of the first imaging unit, the second imaging unit, and the one or more additional imaging units comprises a photoconductor as an x-ray converting layer.

* * * * *